United States Patent
Zojer et al.

(10) Patent No.: US 9,467,061 B2
(45) Date of Patent: Oct. 11, 2016

(54) SYSTEM AND METHOD FOR DRIVING A TRANSISTOR

(71) Applicant: Infineon Technologies Austria AG, Villach (AT)

(72) Inventors: Bernhard Zojer, Villach (AT); Matteo Kutschak, Ludmannsdorf (DE)

(73) Assignee: Infineon Technologies Austria AG, Villach (AT)

( * ) Notice: Subject to any disclaimer, the term of this patent is extended or adjusted under 35 U.S.C. 154(b) by 112 days.

(21) Appl. No.: 14/473,300

(22) Filed: Aug. 29, 2014

(65) Prior Publication Data

US 2016/0065086 A1    Mar. 3, 2016

(51) Int. Cl.
H03K 3/00    (2006.01)
H02M 7/217    (2006.01)
H03K 17/06    (2006.01)

(52) U.S. Cl.
CPC ............ H02M 7/217 (2013.01); H03K 17/063 (2013.01); *H03K 2217/0081* (2013.01)

(58) Field of Classification Search
CPC ........ H02M 1/32; H02M 7/06; H02M 3/155; H02M 3/156; H02M 3/33592; H03K 17/04126; H03K 19/0036
USPC ........... 363/125–127; 323/289; 327/108, 109
See application file for complete search history.

(56) References Cited

U.S. PATENT DOCUMENTS

| | | | |
|---|---|---|---|
| 4,437,096 A * | 3/1984 | Brightman | H03K 17/6257 327/484 |
| 4,992,924 A * | 2/1991 | Gousset | H03K 17/04126 323/289 |
| 5,285,369 A | 2/1994 | Balakrishnan | |
| 5,705,950 A * | 1/1998 | Butler | H03F 1/327 330/100 |
| 5,892,389 A | 4/1999 | Lai | |
| 7,245,175 B2 | 7/2007 | Morita | |
| 7,408,399 B2 | 8/2008 | Salato et al. | |
| 7,557,637 B2 * | 7/2009 | Sakamoto | H03K 17/063 327/109 |
| 7,777,553 B2 | 8/2010 | Friedrichs | |
| 8,228,113 B2 | 7/2012 | Domes | |
| 8,487,667 B2 | 7/2013 | Iwamura | |
| 2009/0009232 A1 | 1/2009 | Helfrich et al. | |
| 2009/0160496 A1 * | 6/2009 | Takeuchi | H03K 19/018564 327/108 |
| 2009/0251217 A1 * | 10/2009 | Keerti | H03F 1/0261 330/264 |
| 2010/0109781 A1 * | 5/2010 | Deguchi | H03F 1/30 330/296 |
| 2011/0025422 A1 * | 2/2011 | Marra | H03F 1/30 330/296 |
| 2012/0133397 A1 | 5/2012 | Draxelmayr et al. | |
| 2012/0133420 A1 * | 5/2012 | Draxelmayr | H02M 3/337 327/430 |
| 2013/0009674 A1 | 1/2013 | Reese et al. | |

(Continued)

FOREIGN PATENT DOCUMENTS

DE    102010027832 B3    7/2011

*Primary Examiner* — Adolf Berhane
(74) *Attorney, Agent, or Firm* — Slater Matsil, LLP

(57) ABSTRACT

In accordance with an embodiment, a circuit for driving a control terminal of a switching transistor includes a driver having an output configured to be coupled to the control terminal of the switching transistor, a first power supply terminal configured to be coupled to a first terminal of a floating power supply, a second power supply terminal configured to be coupled to a second terminal of the floating power supply, and a switching input terminal configured to receive a switching signal. The circuit further includes a bias circuit having an output terminal configured to be coupled to a common-mode control terminal of the floating power supply, wherein the bias circuit is configured to provide a time dependent voltage.

21 Claims, 4 Drawing Sheets

(56) References Cited

U.S. PATENT DOCUMENTS

| | | | |
|---|---|---|---|
| 2014/0049296 A1* | 2/2014 | Jeon | H03K 3/012 327/109 |
| 2014/0078781 A1 | 3/2014 | Imada | |
| 2014/0146428 A1 | 5/2014 | Pansier | |
| 2014/0218112 A1 | 8/2014 | Brantley et al. | |
| 2015/0137619 A1 | 5/2015 | Seeman et al. | |
| 2015/0318851 A1 | 11/2015 | Roberts et al. | |

* cited by examiner

SYSTEM AND METHOD FOR DRIVING A TRANSISTOR

CROSS-REFERENCE TO RELATED APPLICATIONS

This application relates to the following co-pending and commonly assigned patent applications: U.S. patent application Ser. No. 14/473,377, filed on Aug. 29, 2014, which application is incorporated herein by reference in its entirety.

TECHNICAL FIELD

The present disclosure relates generally to an electronic device, and more particularly to a system and method for driving a transistor.

BACKGROUND

High voltage switching transistors, such as power MOSFETs, junction field effect transistor (JFETs) and gallium nitride (GaN) high electron mobility transistor (HEMT), are commonly used as semiconductor switches in high voltage and high power devices such as switched-mode power supplies, motor controllers, and high voltage and high power switching circuits. Some of these devices, such as the GaN HEMT have the ability to be operated at very high voltages without the device breaking down or becoming damaged.

Some devices, such as the JFET and the GaN HEMT may be fabricated to have a negative threshold voltage, thereby causing the device to be conductive when zero voltage is across the gate and source of these transistors. Such devices are accordingly referred to as "normally-on" devices or transistors, since the devices are effectively on under zero bias conditions. When using such normally-on devices, provisions are generally made to ensure that a voltage is generated to make sure that the normally-on device may be turned off. For example, in a driver circuit used in a switch mode power supply, a negative voltage is generated or provided that has a voltage that is sufficiently below the threshold of the normally-on device to ensure that the device is in fact turned off as intended.

SUMMARY OF THE INVENTION

In accordance with an embodiment, a circuit for driving a control terminal of a switching transistor includes a driver having an output configured to be coupled to the control terminal of the switching transistor, a first power supply terminal configured to be coupled to a first terminal of a floating power supply, a second power supply terminal configured to be coupled to a second terminal of the floating power supply, and a switching input terminal configured to receive a switching signal. The circuit further includes a bias circuit having an output terminal configured to be coupled to a common-mode control terminal of the floating power supply, wherein the bias circuit is configured to provide a time dependent voltage.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for driving a normally-on switching transistor. Embodiments of the present invention may also be applied to various systems that utilize normally-on transistors, such as switched-mode power supplies, motor controllers, and other circuits. Embodiments may also be directed to driving normally-off transistors as well.

In an embodiment of the present invention, a circuit is configured to drive control terminal of a switching transistor. This switching transistor may have a negative threshold, such as a JFET, gallium nitride (GaN) HEMT, depletion mode MOSFET or other transistor having a negative threshold, or may have a positive threshold, such as an enhancement mode MOSFET. The driver includes power supply terminals that are coupled to a floating power supply. The floating power supply may produce a positive voltage and a negative voltage that are coupled to the power supply terminals of the driver. During operation, the driver applies the positive voltage of the floating power supply to turn on the switching transistor and applies the negative voltage of the floating power supply to turn-off the switching transistor. A common-mode bias circuit is also provided to bias the common mode or average voltage of the floating power supply. In some embodiments, this common mode voltage may produce a time dependent voltage that may depend on various parameters.

In one specific example, this common mode voltage may depend on the threshold of the transistor being driven or a replica device thereof. In one such embodiment, the common mode voltage is set to be at or about the threshold of switching transistor. Embodiments of the present invention may be applied to driving switching transistors have negative, positive and/or zero thresholds.

Figure 1A:
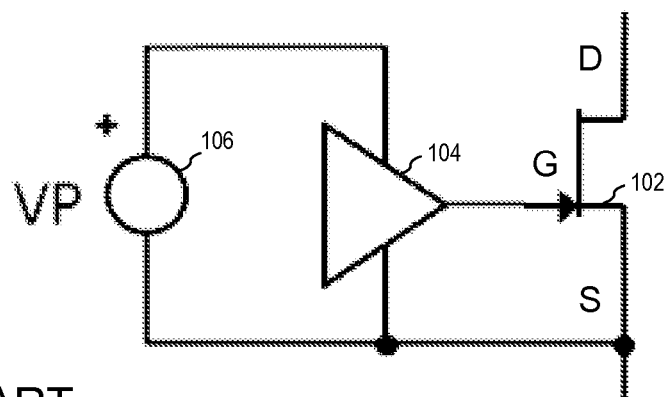
FIGS. 1a-c illustrate conventional switch driving system.

FIG. 1a illustrates a conventional switch driving system 100 including voltage source 106, driver circuit 104 and normally-off transistor 102. As shown, driver 104 is supplied with a fixed voltage VP from voltage source 106 that is related to the source potential S of transistor 102. The threshold voltage Vth of transistor 102 is the gate-to-source voltage level that defines the transition between "on" and "off" state. In the case of a positive threshold Vth found in "normally-off" transistor 102, the illustrated supply scheme utilizes a single positive voltage source 106. During operation of system 100, driver 104 applies the voltage VP at gate G of normally-off transistor 102. If voltage VP is greater than the threshold Vth of normally-off transistor 102, normally-off transistor 102 is turned on. Likewise, if the voltage at the negative terminal of voltage source 106 is applied at gate G of normally-off transistor 102, normally-off transistor is turned off.

Figure 1B:
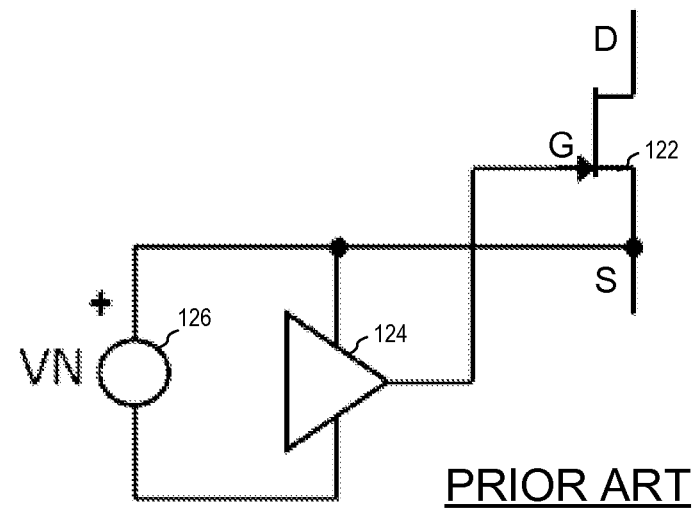

FIG. 1b illustrates a conventional switch driving system 120 including voltage source 126, driver circuit 124 and normally-on transistor 122. As shown, driver circuit 124 is supplied with a fixed voltage VN from voltage source 126 that is related to the source potential S of transistor 122. Similar to normally-off transistor 102 shown in FIG. 1b, the threshold voltage Vth of transistor 122 is the gate-to-source voltage level that defines the transition between "on" and "off" state. However, in the case of normally-on transistor 122, this threshold Vth is a negative voltage, meaning that the voltage of gate G of normally-on transistor 122 is brought to a voltage potential that is less than the voltage of source node S in order to turn off normally-on transistor 122. Accordingly, if the voltage potential VN of voltage source 126 exceeds the negative threshold Vth of normally-on transistor 122, normally-on transistor may be turned off by applying the voltage at the negative terminal of voltage source 126. However, when the gate-source voltage of normally-on transistor 122 is zero voltage, normally-on transistor 122 is conductive.

Figure 1C:
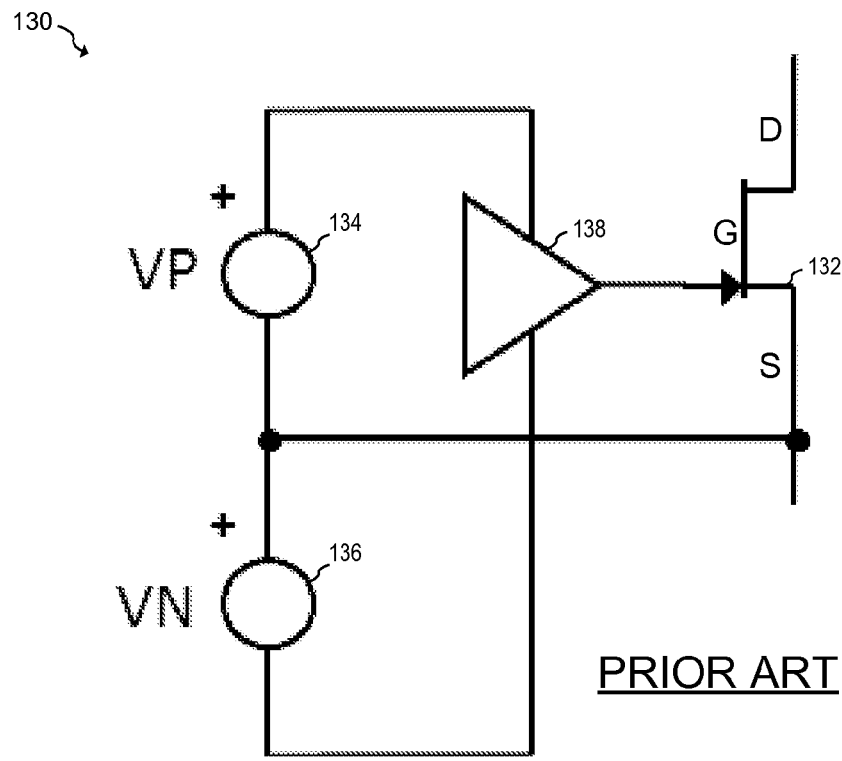

In cases where the threshold Vth of the transistor being driven is a low positive or negative voltage close to ground, a bipolar driving scheme may be used to ensure that the transistor is turned on and turned off. FIG. 1c illustrates a conventional bipolar switch driving system 130 including positive voltage source 134, negative voltage source 136, driver circuit 138 and transistor 132. When transistor 132 is turned on, voltage VP produced by positive voltage source 134 is applied to gate connection G of transistor 132. Likewise, when transistor 132 is turned off, voltage VN produced by negative voltage source 136 is applied to gate connection G of transistor 132. Using such a bipolar driving scheme may improve switching performance when the threshold Vth is a low voltage, and may provide margin to ensure that transistor 132 properly switches. For example, if the threshold Vth of transistor 132 is about 1V, driving transistor 132 with a positive power supply of 12 V may provide an asymmetric drive voltage. In such cases, using negative voltage source 136 helps to ensure that transistor 132 is turned off with sufficient overdrive.

Because threshold Vth of a transistor may change over temperature variation, process variation, statistical variations, drift effects, and other causes, such changes are often taken into account during the design of conventional driver circuits. For example, if the threshold Vth of a normally-on transistor is subject to vary between −5 V and −9 V, a negative supply voltage in a conventional system provides a negative voltage that is configured to provide enough overdrive to turn off the transistor. In this example, a negative voltage of −11 V provides 2 V of over drive to turn off the transistor in the worst case scenario when the threshold Vth of the normally-on transistor is at −9 V.

In an embodiment, supply voltages for a gate driver are related to a gate potential that corresponds to a switching threshold, for example, VG=VS+Vth. In other words, the driving levels are related to VS+Vth rather than VS directly. Thus, a positive gate drive level ("on") may be expressed as Vth+VP (positive overdrive), and the negative level ("off") may be expressed as Vth−VN. However, under real operating conditions, the instantaneous threshold Vth may change over time due to changes in temperature and other drift effects.

Figure 2:
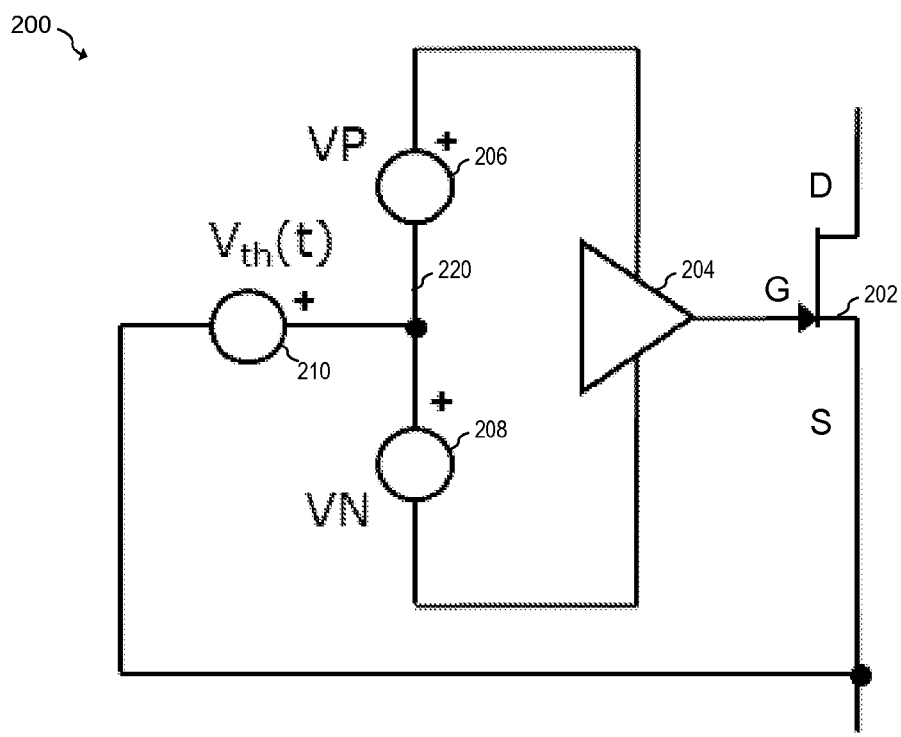
FIG. 2 illustrates a switch driving system according to an embodiment.

FIG. 2 illustrates an switch driving system 200 that includes positive voltage source 206, negative voltage source 208, driver circuit 204 and transistor 202. Transistor 202 may be implemented using various types of transistors. For example, transistor 202 may include, but is not limited to, a power MOSFET transistor, a GaN HEMT, a JFET, an enhancement-mode MOSFET, a depletion-mode MOSFET or a bipolar junction transistor (BJT).

In some embodiments, the combination of positive voltage source 206, negative voltage source 208 form a floating power supply whose common mode voltage may be set by applying a voltage to common node 220 coupled between positive voltage source 206 and negative voltage source 208. By coupling voltage source 210 between common node 220 and source node S of transistor 202, the common mode output of driver circuit 204 may be set to correspond to the time dependent threshold $V_{th}(t)$ of transistor 202, or any other time dependent voltage. In some embodiments in which the outputs of voltage source 206 and 208 track the threshold voltage of transistor 202, voltage VP of positive voltage source 206 and voltage VN of negative voltage source 208 may be selected without having to take into account threshold variation of transistor 202. In such embodiments, the minimum values of VP and VN may be selected according to switching dynamics.

For example, in one embodiment, voltage sources 206 and 208 are each set to produce about 3 V and voltage source 210 is configured to provide a voltage that approximates the threshold voltage of transistor 202. Thus, if the approximation of the threshold voltage of transistor 202 is about −5 V, voltage source 210 provides about −5 V, the positive terminal of voltage source 206 provides about −2 V, and the negative terminal of voltage source 208 provides about −8V. In alternative embodiments, other voltage levels may be used depending on the particular system and its specifications.

Voltage sources 206 and 208 may be implemented using power circuits known in the art. For example, switch-mode power supplies, voltage regulators, batteries, and other power supply circuits and systems may be used to implement voltage source 206 and 208. For example, Voltage source 210 may be implemented using various bias circuits and/or power supply circuits known in the art. In some embodiments, voltage source 210 may be implemented using a replica of transistor 202 to produce a voltage that approximates the threshold Vth of transistor 202. Driver circuit 204 may be implemented using driver circuits known in the art, such as a driver from the Infineon EiceDRIVER family, or a Texas Instruments UCC27x series driver.

Figure 3:
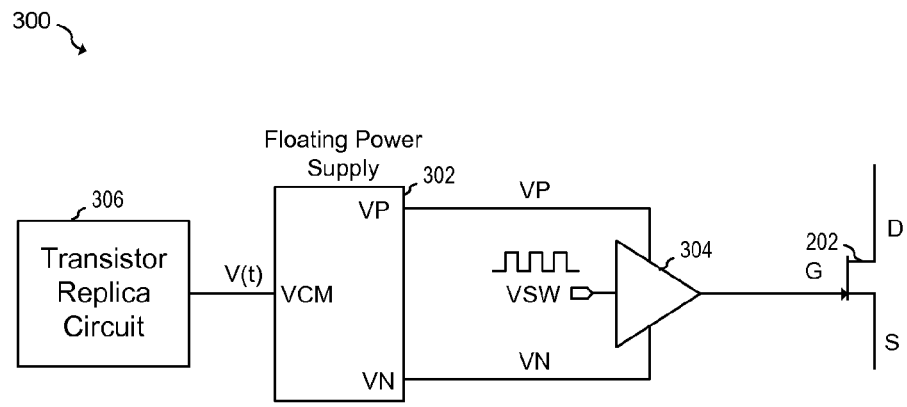
FIG. 3 illustrates a switch driving system according to another embodiment.

FIG. 3 illustrates a switch driving system 300 according to an embodiment of the present invention. As shown, transistor replica circuit 306 generates time dependent voltage V(t) that is coupled to the common mode terminal VCM of floating power supply 302. In an embodiment, floating power supply 302 produces voltage at terminal VP that is at a voltage potential greater than the voltage at terminal VCM, and produces a voltage at terminal VN that is at a voltage potential less than the voltage at terminal VCM. Effectively, the voltages at terminals VP and VN track the voltage V(t) produced by transistor replica circuit 306.

In an embodiment, transistor replica circuit 306 produces voltage V(t) that approximates and/or is related to the threshold voltage of transistor 202 by using a transistor having a similar structure and/or device geometry as transistor 202. Voltage V(t) may vary over time to track changes in threshold with respect to temperature, drift effects, and changes in other parameters that may affect the threshold of transistor and the replica device in transistor replica circuit 306. In alternative embodiments, voltage V(t) may be produced by other types of circuits besides transistor replica circuit 306.

Driver circuit 304 has power supply terminals coupled to terminals VP and VN of floating power supply 302. In an embodiment, driver circuit alternatingly applies the voltages at terminals VP and VN of floating power supply 302 at gate connection G of transistor 202 according to a switching signal at input VSW of driver circuit 304. For example, in one embodiment, driver circuit 304 applies the voltage at terminal VP of floating power supply 302 when the signal at input VSW is a logic HIGH, and applies the voltage at terminal VN of floating power supply 302 when the signal at input VSW is a logic LOW. Alternatively, the relationship between the logic sense of input VSW and the voltage applied to the gate of transistor 202 may be inverted. In some embodiments, the output of driver circuit 304 may introduce a voltage drop between its power supply connections and its output terminal.

Figure 4:
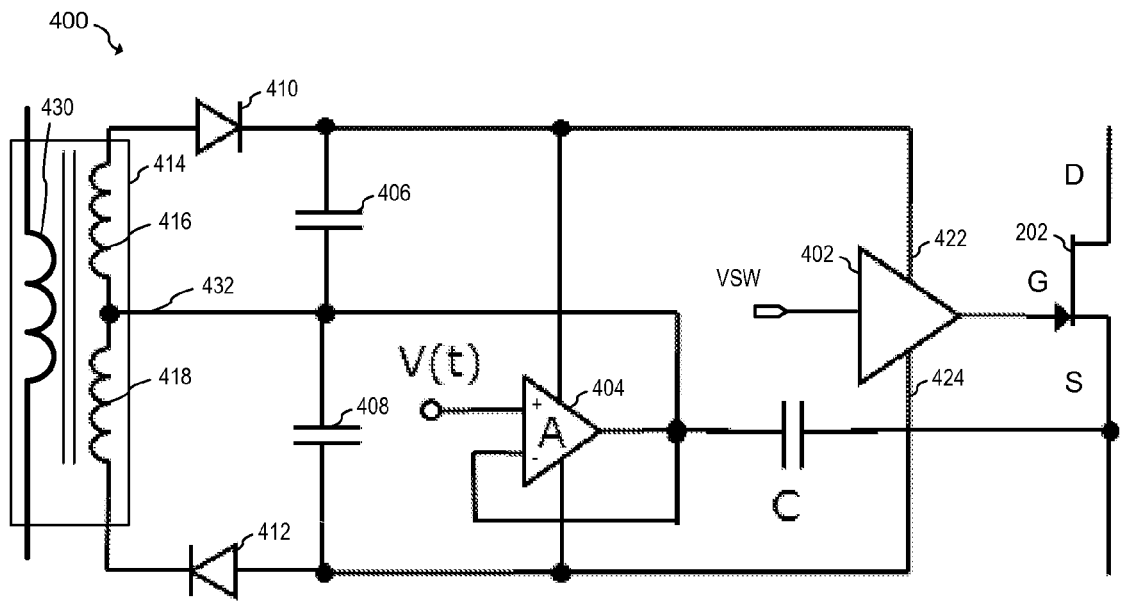
FIG. 4 illustrates a switch driving system according to a further embodiment.

FIG. 4 illustrates a switch driving system 400 according to a further embodiment of the present invention, in which the floating power supply is implemented using a center-tapped windings 416 and 418 of transformer 414. In an embodiment, windings 416 and 418 may be secondary and/or auxiliary windings of a transformer of a switched mode power supply, such as a flyback converter. In some embodiments, transformer 414 may include a primary winding 430 coupled to primary-side switched-mode power supply circuitry, which is not shown for simplicity of illustration. The implementation and operation of such primary-side switched-mode power supply circuitry may be implemented using circuits and methods known in the art.

Switch driving system 400 includes transistor 202, and driving circuit 402 configured to apply a switching signal VSW to the gate of transistor 202. Transistor 202 may be any type of transistor having, for example, a positive threshold voltage or a negative threshold voltage. The positive power supply terminal 422 of driver circuit 402 is coupled to winding 416 of transformer 414 via diode 410 and the negative power supply terminal 424 of driver circuit 402 is coupled to winding 418 of transformer 414 via diode 412. Diodes 410 and 412 rectify the current in windings 416 and 418 of transformer 414. In some embodiments, diodes 410 and 412 may be implemented using switching transistors operated as synchronous rectifiers. Capacitors 406 and 408 coupled to diodes 410 and 412 provide filtering and attenuate supply ripple.

Unity gain buffer amplifier 404 is configured to buffer voltage V(t) to center tap connection 432 of transformer 414. Voltage V(t) may represent, for example, a voltage that approximates the threshold of transistor 202. Alternatively, voltage V(t) may be any time-dependent voltage. In many embodiments, the time variation of V(t) is slow compared with the switching transients. Then capacitor C, which is coupled between source node S of transistor 202 and the output of unity gain buffer amplifier 404, blocks the common mode supply component V(t), but provides a low impedance path for the fast switching transients.

Amplifier 404, which is shown in unity gain feedback configuration, may be implemented using a transconductance amplifier, an operational amplifier or other type of amplifier known in the art. In alternative embodiments, other amplifier configurations may be used besides a unity gain configuration. For example, an amplifier having a gain of less than one or greater than one may be used. In some embodiments, amplifier 404 may be omitted. It should be appreciated that system 400 is just one of many embodiment examples that may be used to implement embodiment transistor driving circuits and systems. In alternative embodiments, other circuit architectures and topologies may be used.

Figure 5:
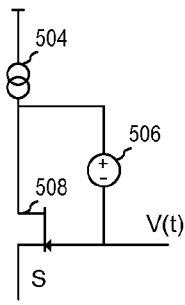
FIG. 5 illustrates an embodiment replica transistor circuit.

FIG. 5 illustrates an example embodiment circuit used to generate time dependent voltage V(t) based on a replica of the switching transistor to be driven. As shown, replica transistor 508 is coupled in a diode connected configuration with its drain coupled to its gate. Voltage source 506 may be coupled between the drain and gate of replica transistor 508 in order to accommodate negative thresholds for normally-on devices. Current source 504 is coupled to replica transistor 508 and provides a bias current. According to various embodiments, source node S of replica transistor 508 is coupled to the same node as source of the switching transistor being driven (e.g. transistor 202 in FIGS. 3 and 4), or is coupled to a node having a same or similar voltage as the source of the switching transistor.

In an embodiment, replica transistor 508 has a similar structure as the driven switching transistor. For example, if the switching transistor is a GaN HEMT, replica transistor 508 is also a GaN HEMT. In some embodiments, the geometry of the replica transistor may also match the geometry of the switching transistor. For example, the switching transistor may be constructed using n unit devices, while the replica transistor may be implemented using one or two of the unit device. In such embodiments, the current of current source 504 need only be on the order of 1/n of the current of the switching transistor in order for V(t) to track the threshold of the switching transistor. In some embodiments, the unit devices of replica transistor 508 may be co-located along with the switching transistor to enhance matching performance. By co-locating the replica transistor 508 with the main switching transistor, changes in temperature in the switching transistor are applied to replica transistor 508.

It should be understood that the circuit of FIG. 5 is just one of many examples of circuits that may be used to produce an approximation of a threshold voltage of a switching transistor. In alternative embodiments, circuit and systems described in co-pending application U.S. Ser. No. 14/473,377, may be used to produce an approximation of the threshold voltage.

Figure 6:
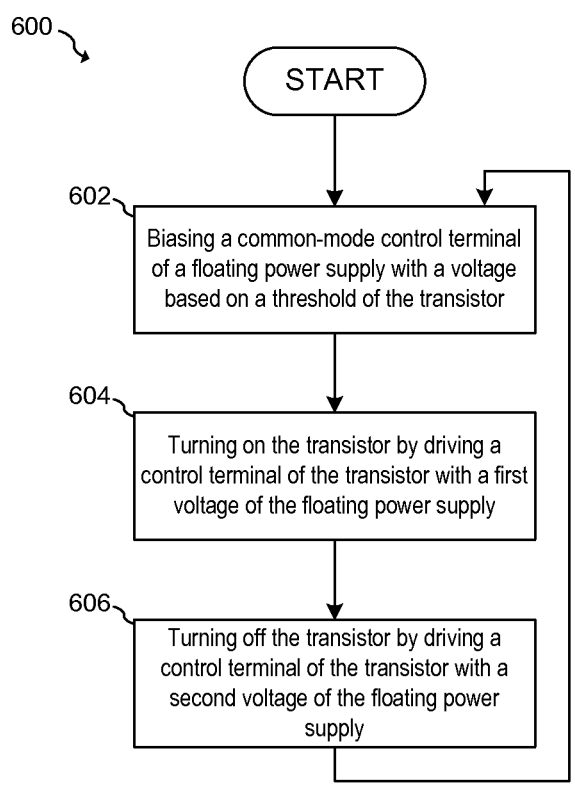
FIG. 6 illustrates a flowchart of an embodiment method.

FIG. 6 illustrates a flowchart of an embodiment method 600 of driving a switching transistor. This method maybe used, for example, in conjunction with various illustrated embodiments disclosed herein. In an embodiment, a common mode control terminal of a floating power supply is biased with a voltage based on a threshold of the switching transistor in step 602. In step 604, the switching transistor is turned on by driving a control terminal of the switching transistor with a first voltage of the floating power supply, and in step 606, the switching transistor is turned off by driving the control terminal of the switching transistor with a second voltage of the floating power supply.

In accordance with an embodiment, a circuit for driving a control terminal of a switching transistor includes a driver having an output configured to be coupled to the control terminal of the switching transistor, a first power supply terminal configured to be coupled to a first terminal of a floating power supply, a second power supply terminal configured to be coupled to a second terminal of the floating power supply, and a switching input terminal configured to receive a switching signal. The circuit further includes a bias circuit having an output terminal configured to be coupled to a common-mode control terminal of the floating power supply, wherein the bias circuit is configured to provide a time dependent voltage. In some embodiments, the circuit further includes the floating power supply.

In an embodiment, the floating power supply includes a first coil, a first diode coupled between the first terminal of the floating power supply and the first coil, a second coil coupled to the first coil at the common-mode control terminal and to the second terminal of the floating power supply, and a second diode coupled between the second coil and the second terminal of the floating power supply. The second coil is magnetically coupled to the first coil.

In an embodiment, the switching transistor includes a normally-on transistor that may be a part of the circuit. The normally-on transistor may be implemented using a GaN HEMT device, and the control terminal of the normally-on transistor may be a gate of the GaN HEMT. In some embodiments, the time dependent voltage is a voltage based on a threshold of the switching transistor. This voltage may be based on the threshold of the switching transistor and may be a voltage being substantially equal to the threshold of the switching transistor. In an embodiment, the bias circuit has a replica of the switching transistor.

In an embodiment, the driver is configured to turn-on the switching transistor by coupling a voltage of the first power supply terminal to the control terminal of the transistor, and turn-off the switching transistor by coupling a voltage of the second power supply terminal to the control terminal of the switching transistor.

In accordance with a further embodiment, a method of controlling a switching transistor includes turning on the switching transistor by driving a control terminal of the switching transistor with a first voltage of a floating power supply, turning off the switching transistor by driving a control terminal of the switching transistor with a second voltage of the floating power supply, and biasing a common-mode control terminal of the floating power supply with a voltage based on a threshold of the switching transistor, which may be substantially equal to the threshold of the switching transistor. Biasing the common-mode control terminal of the floating power supply may include providing a threshold voltage of a replica of the switching transistor.

In an embodiment, the steps of turning on and turning off are performed according to a switching signal. The switching transistor may include a normally-on transistor, and switching transistor includes a GaN HEMT device, such that the control terminal of the switching transistor is a gate of the GaN HEMT.

In accordance with a further embodiment, a switching circuit includes a floating power supply having a positive terminal, a negative terminal, and a common-mode terminal. The switching circuit further includes a driver circuit having a first power supply terminal coupled to the positive terminal of the power supply, a second power supply terminal coupled to the negative terminal of the power supply, and an output terminal configured to be coupled to a control terminal of a switching transistor. The switching circuit further includes a common-mode bias circuit having an output coupled to the common-mode terminal of the floating power supply, such that the common-mode bias circuit is configured to provide a voltage based on a threshold of the switching transistor at the output of the common-mode bias circuit. In some embodiments, the switching circuit includes the switching transistor.

In an embodiment, the switching transistor includes a normally-on transistor, and the normally-on transistor includes a GaN HEMT device, such that the control terminal of the switching transistor comprises a gate of the GaN HEMT. The common-mode bias circuit may include a voltage buffer amplifier having an output coupled to the common-mode terminal of the floating power supply.

The switching circuit may include a capacitor coupled between a load-path terminal of the switching transistor and the output of the voltage buffer amplifier, and may also include a replica transistor coupled to an input of the voltage buffer amplifier. In some embodiments, the floating power supply includes a transformer and the common-mode terminal of the floating power supply includes a center-tap terminal of the transformer.

Advantages of some embodiments include power savings due to lower supply voltages being used to provide power to switch drivers. A further advantage includes the ability to track threshold voltage variation over time, and the ability to provide symmetric driving voltages to switching transistors.

Further advantages of embodiments include the ability to vary the gate drive levels not only with respect to transistor threshold, but also take into account other aspects such as the transistor operation mode (switch/diode), load current variation or switching speed.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A circuit for driving a control terminal of a switching transistor, the circuit comprising:
   a driver comprising an output configured to be coupled to the control terminal of the switching transistor, a first power supply terminal configured to be coupled to a first terminal of a floating power supply, a second power supply terminal configured to be coupled to a second terminal of the floating power supply, and a switching input terminal configured to receive a switching signal; and
   a bias circuit having an output terminal configured to be coupled to a common-mode control terminal of the floating power supply, wherein the bias circuit is configured to provide a time dependent common-mode voltage to the floating power supply.

2. The circuit of claim 1, wherein the floating power supply comprises: a first coil;
   a first diode coupled between the first terminal of the floating power supply and the first coil; a second coil coupled to the first coil at the common-mode control terminal and to the second terminal of the floating power supply; and a second diode coupled between the second coil and the second terminal of the floating power supply, wherein the second coil is magnetically coupled to the first coil.

3. The circuit of claim 1, wherein the switching transistor comprises a normally-on transistor.

4. The circuit of claim 3, wherein the normally-on transistor comprises a GaN HEMT device, and the control terminal of the normally-on transistor comprises a gate of the GaN HEMT device.

5. The circuit of claim 4, wherein the time dependent common-mode voltage comprises a voltage based on a threshold of the switching transistor.

6. The circuit of claim 5, wherein the voltage based on the threshold of the switching transistor comprises a voltage being substantially equal to the threshold of the switching transistor.

7. The circuit of claim 6, wherein the bias circuit comprises a replica of the switching transistor.

8. The circuit of claim 1, wherein the driver is configured to:
turn-on the switching transistor by coupling a voltage of the first power supply terminal to the control terminal of the switching transistor; and
turn-off the switching transistor by coupling a voltage of the second power supply terminal to the control terminal of the switching transistor.

9. A method of controlling a switching transistor, the method comprising:
turning on the switching transistor by driving a control terminal of the switching transistor with a first voltage of a floating power supply;
turning off the switching transistor by driving a control terminal of the switching transistor with a second voltage of the floating power supply; and
biasing a common-mode control terminal of the floating power supply with a voltage based on a threshold of the switching transistor.

10. The method of claim 9, wherein the voltage based on the threshold of the switching transistor is substantially equal to the threshold of the switching transistor.

11. The method of claim 10, wherein biasing the common-mode control terminal of the floating power supply comprises providing a threshold voltage of a replica of the switching transistor.

12. The method of claim 9, wherein the steps of turning on and turning off are performed according to a switching signal.

13. The method of claim 9, wherein the switching transistor comprises a normally-on transistor.

14. The method of claim 13, wherein the switching transistor comprises a GaN HEMT device, and the control terminal of the switching transistor comprises a gate of the GaN HEMT device.

15. A switching circuit comprising:
a floating power supply comprising a positive terminal, a negative terminal, and a common-mode terminal;
a driver circuit comprising a first power supply terminal coupled to the positive terminal of the floating power supply, a second power supply terminal coupled to the negative terminal of the floating power supply, and an output terminal configured to be coupled to a control terminal of a switching transistor; and
a common-mode bias circuit having an output coupled to the common-mode terminal of the floating power supply, wherein the common-mode bias circuit is configured to provide a voltage based on a threshold of the switching transistor at the output of the common-mode bias circuit.

16. The switching circuit of claim 15, wherein: the switching transistor comprises a normally-on transistor; and the normally-on transistor comprises a GaN HEMT device, and the control terminal of the switching transistor comprises a gate of the GaN HEMT device.

17. The switching circuit of claim 15, wherein the common-mode bias circuit comprises a voltage buffer amplifier having an output coupled to the common-mode terminal of the floating power supply.

18. The switching circuit of claim 17, further comprising a capacitor coupled between a load-path terminal of the switching transistor and the output of the voltage buffer amplifier.

19. The switching circuit of claim 18, further comprising a replica transistor coupled to an input of the voltage buffer amplifier.

20. The switching circuit of claim 15, wherein the floating power supply comprises a transformer and the common-mode terminal of the floating power supply comprises a center-tap terminal of the transformer.

21. A circuit for driving a control terminal of a switching transistor, the circuit comprising: the switching transistor; a floating power supply; a driver comprising an output coupled to the control terminal of the switching transistor, a first power supply terminal coupled to a first terminal of the floating power supply, a second power supply terminal coupled to a second terminal of the floating power supply, and a switching input terminal configured to receive a switching signal; and a bias circuit having an output terminal coupled to a common-mode control terminal of the floating power supply, wherein the bias circuit is configured to provide a time dependent common-mode voltage to the floating power supply.

* * * * *